United States Patent [19]

Smashey et al.

[11] 4,115,112

[45] Sep. 19, 1978

[54] COBALT-BASE ALLOY AND ARTICLE

[75] Inventors: Russell W. Smashey, Albuquerque, N. Mex.; Elmer L. Frey, Cincinnati, Ohio; George V. Cash, Melrose; George S. Irons, Marblehead, both of Mass.

[73] Assignee: General Electric Company, Cincinnati, Ohio

[21] Appl. No.: 817,638

[22] Filed: Jul. 21, 1977

[51] Int. Cl.² .............................................. C22C 19/07
[52] U.S. Cl. .......................................... 75/171; 148/32
[58] Field of Search .................... 75/171, 170; 148/32, 148/32.5

[56] References Cited

U.S. PATENT DOCUMENTS 3,960,552   6/1976   Woulds .................. 75/171

Primary Examiner—R. Dean
Attorney, Agent, or Firm—Lee H. Sachs; Derek P. Lawrence

[57] ABSTRACT

A commercially available cobalt-base alloy, sometimes called X-40 alloy, and having a relatively high carbon content, is improved to make it useful in the directional solidification casting process through the addition of a particular amount of aluminum sufficient to avoid severe reaction with casting cores and molds which include silica, without detrimental effect on mechanical properties.

5 Claims, No Drawings

COBALT-BASE ALLOY AND ARTICLE

FIELD OF THE INVENTION

This invention relates to cobalt-base alloys and, more particularly, to cobalt-base superalloys useful in the manufacture of articles for gas turbine applications.

BACKGROUND OF THE INVENTION

A commercially available cobalt-base alloy, sometimes referred to as X-40 alloy, has been used for several years in the manufacture of components for gas turbine engines. For example, it has found a relatively wide application in the manufacture of conventionally cast turbine vanes. One specification for X-40 alloy defines its composition, by weight, as 0.45 – 0.55% C, 24.5 – 26.5% Cr, 9.5 – 11.5% Ni, 7 – 8% W, up to 2% Fe, up to 1% each of Si and Mn, up to 0.25% Zr, up to 0.04% S, with the balance Co. Thus, such alloy composition is characterized by relatively high carbon content and the absence of aluminum which was generally believed in this alloy to contribute to decreasing such properties as nil-strength temperature and stress rupture. Although the element Al was not intentionally added to such alloy, an analysis of production heats has shown the presence of up to about 0.4% Al as an impurity.

Many thousands of gas turbine engine articles have been manufactured from X-40 alloy by the conventional casting process in which generally uniformly dimensioned, sometimes called "equi-axed", grain structure is produced and the time of contact between molten alloy and the mold or cores with which it comes in contact is relatively short. However, with the development of the directional solidification process, for example of the type described in U.S. Pat. No. 3,897,815 — Smashey, or the type described in U.S. Pat. No. 3,494,709 — Piearcey, the disclosures of which are incorporated herein by reference, casting materials and conditions were dramatically changed. For example, such casting process requires relatively long times of contact between molten alloy and ceramic cores, which includes silica to provide the core with sufficient properties to withstand the directional solidification process. Because of the high carbon content of X-40 alloy, there was experienced reaction of the molten metal with silica in the core to form a gaseous oxide of carbon and liquid-phase Si. This reaction resulted in deterioration of the casting surface about the area of reactivity.

SUMMARY OF THE INVENTION

It is a principal object of the present invention to provide an improved cobalt-base alloy having the general properties of X-40 alloy without the characteristic of reacting with silica in ceramics used in the directional solidification process.

Another object is to provide a cobalt-base alloy article from such an alloy, made by a directional solidification method to result in a unidirectionally oriented microstructure including at least one grain.

These and other objects and advantages will be more clearly understood from the following detailed description and the examples, all of which are intended to be typical of rather than in any way limiting on the scope of the present invention.

Briefly, the present invention provides an improved cobalt-base alloy of the X-40 type, which has relatively high carbon and normally only impurity levels of aluminum, through the inclusion in such composition of aluminum in the range of from about 0.7 up to about 2 weight percent. More specifically, the cobalt-base alloy of the present invention consists essentially of, by weight, at least about 0.2% C, about 0.7 – 2% Al, 24 – 27% Cr, up to about 2% Fe, about 7 – 8% W, about 9 – 12% Ni, up to about 0.3% Zr, up to about 0.1% B, up to about 1% Si, up to about 1% Mn, with the balance essentially Co and incidental impurities. More specifically preferred is the composition, by weight, 0.45 – 0.55% C, 0.75 – 1.5% Al, 24.5 – 26.5% Cr, up to 2% Fe, 7 – 8% W, 9.5 – 11.5% Ni, up to about 0.25% Zr, up to about 0.05% B, up to about 1% Si, up to about 1% Mn, with the balance essentially cobalt and incidental impurities.

DESCRIPTION OF THE PREFERRED EMBODIMENTS

The commercially available X-40 alloy has been a reliable alloy in the manufacture of such gas turbine engine components as conventionally cast turbine vanes. However, attempts to make hollow X-40 alloy castings by the directional solidification process, for example of the type identified in the above-mentioned Smashey patent, using a casting core of the $SiO_2$ type has identified a problem relating to core reactivity. When certain ceramic cores including silica are used in the directional solidification process, a severe reaction has been observed at the metal/core interface believed due to the high carbon content of the X-40 type alloy reacting with the silica to form a gaseous oxide of carbon. Such gas, which is trapped at the internal interface between the vane and the core, causes deterioration of the casting in that area.

During the evaluation of the present invention, a variety of alloy forms of the present invention and of the commercially available X-40 alloy were studied. As a result, it was recognized that through inclusion of at least about 0.7 wt. % Al in the composition, there was generated during casting a very thin film of $Al_2O_3$ at the surface of the core which included silica. Evaluation of the commercially available X-40 alloy indicated that as much as about 0.4% Al was included as an impurity. However, this amount of Al was found to be insufficient to form a continuous $Al_2O_3$ film. Subsequently, heats of such commercially available alloy with 0.25 and 0.5 wt. % Al added to its composition confirmed that finding and showed core reactivity as described above. Evaluation of a 0.65% Al content alloy showed the successful formation of the film of $Al_2O_3$. However, such film was not sufficiently thick to protect the core in the last areas of the casting to solidify in the directional solidification process, i.e., where the core was in contact with the molten alloy for the longest time. A series of alloy heats were prepared to evaluate the aluminum content in a range of at least about 0.7 wt. % and particularly in the range of about 0.7 – 2 wt. %. The basis for all such heats was the above-described X-40 alloy composition range to which selected amounts of Al were added. In the following Table, the chemical compositions of typical forms of the present invention within its preferred range are compared with the composition of a typical or standard heat of X-40 alloy to which no aluminum was purposely added. In the following Table, such standard X-40 alloy heat is identified as 4110 whereas the other heats shown are within the scope of the present invention.

TABLE

NOMINAL COMPOSITION
wt. % - Balance Co and incidental impurities

| Heat | C | Cr | Ni | W | Fe | Al | Zr | B |
|---|---|---|---|---|---|---|---|---|
| 4110 | .45 | 23.9 | 10.7 | 7.2 | .4 | .27 | .10 | |
| 1 | .48 | 25.1 | 11.0 | 7.3 | .4 | .75 | .17 | |
| 2 | .47 | 24.9 | 10.8 | 7.2 | .4 | 1.5 | .17 | |
| 849 | .50 | 26.0 | 10.1 | 7.0 | .8 | .70 | .17 | .008 |
| 863 | .46 | 23.9 | 10.7 | 7.2 | .4 | .98 | .14 | .009 |
| 877 | .45 | 24.6 | 10.9 | 7.2 | .3 | .88 | .13 | .005 |
| 884 | .44 | 23.7 | 10.9 | 7.3 | .3 | .86 | .08 | .009 |
| 885 | .45 | 23.2 | 11.0 | 7.2 | .3 | .90 | .13 | .011 |
| 914 | .45 | 24.6 | 10.8 | 7.2 | .2 | .94 | .16 | .003 |
| 915 | .46 | 24.4 | 11.0 | 7.2 | .2 | .90 | .15 | .003 |
| 934 | .46 | 24.1 | 11.1 | 7.2 | .2 | .89 | .16 | .003 |
| 935 | .46 | 24.2 | 10.9 | 7.2 | .2 | .89 | .16 | .004 |

In the evaluation of the heats of the Table, articles were made by the directional solidification method described in the above-identified Smashey patent, which is incorporated herein by reference. Such evaluation was for the purpose of studying core reactivity. It was observed that Heat 4110 reacted with the silica core to result in deterioration of the article surface at the metal/core interface. However, no such reactivity was observed with the other heats shown in the Table. It is believed that this resulted from provision of a thin $Al_2O_3$ film which completely protected the molten alloy from the silica in the core.

The quantity of Al defined by the present invention had not been added to an alloy of the X-40 alloy type because of the belief that aluminum would have a detrimental effect on such properties as nil-strength temperature and stress rupture properties. The nil-strength temperature is defined as the temperature which causes instantaneous failure of a test bar stressed to 300 psi. The nil-strength test was designed to evaluate the burn-out resistance of materials subjected to very high temperatures, for example, gas turbine combustors, nozzles and vanes. However, extensive testing has shown that an aluminum addition within the range of the present invention does not significantly affect such properties. More specifically, extensive tests comparing conventional X-40 alloy as represented by Heat 4110, with the improved alloy of the present invention, as represented by Heats 849 and 863 of the Table were conducted. Such tests included tensile strength and ductility, creep strength, stress rupture strength, low cycle fatigue, thermal fatigue resistance and nil-strength temperature among others. These tests were conducted on test specimens in the conventional cast as well as directionally solidified conditions, aluminide coated as well as uncoated conditions, in the transverse and longitudinal directions for the directionally solidified conditions, in the temperature range up to 2100° F, and after several heat treatments. Analysis of all of these data shows that the addition of Al to the X-40 type alloy, within the range of the present invention, had substantially no detrimental effect on such properties and in some cases improved properties. For example, directionally solidified alloy specimens within the scope of the present invention were twenty times more resistant to thermal fatigue in the longitudinal direction as compared with standard X-40 alloy specimens.

From these data, it can be recognized that the alloy of the present invention, through a careful addition of Al in the presence of relatively high carbon in a cobalt-base alloy of the X-40 alloy type, can provide improved capability for casting articles, particularly in the directional solidification type process. Such an article, which has either columnar grain structure or is a single crystal, can be cast without substantial reaction with silica in the ceramics generally required in the directional solidification processes. Although the present invention has been described in connection with specific examples and embodiments, it will be readily understood by those skilled in the art the modifications and variations of which it is capable.

What is claimed is:

1. In a cobalt-base alloy consisting essentially, by weight, of at least about 0.2% C, about 24 - 27% Cr, about 9 - 12% Ni, about 7 - 8% W, up to about 2% Fe, up to about 0.3% Zr, up to about 0.1% B, up to about 1% Si, up to about 1% Mn, with the balance essentially Co, and incidental impurities which can include up to about 0.4% Al, the improvement comprising the inclusion of Al in the composition in the range of about 0.7 up to about 2 wt. %.

2. The alloy of claim 1 in which Al is about 0.7 - 1.5% and C is at least about 0.4%.

3. The alloy of claim 2 consisting essentially of, by weight, 0.45 - 0.55% C, 24.5 - 26.5% Cr, 9.5 - 11.5% Ni, 7 - 8% W, up to about 2% Fe, up to about 0.25% Zr, up to about 0.05% B, up to about 1% Si, up to about 1% Mn, 0.75 - 1.5% Al, with the balance essentially Co and incidental impurities.

4. A cast article of the alloy of claim 1 and having a unidirectionally oriented microstructure.

5. A cast article in the form of a gas turbine engine airfoil member having a columnar grain structure, anisotropic properties and cast from the alloy of claim 2.

* * * * *